(12) United States Patent
Dharmapurikar et al.

(10) Patent No.: US 9,627,063 B2
(45) Date of Patent: Apr. 18, 2017

(54) TERNARY CONTENT ADDRESSABLE MEMORY UTILIZING COMMON MASKS AND HASH LOOKUPS

(71) Applicant: Cisco Technology, Inc., San Jose, CA (US)

(72) Inventors: Sarang M. Dharmapurikar, Cupertino, CA (US); Francisco M. Matus, Saratoga, CA (US); Kit Chiu Chu, Fremont, CA (US); Georges Akis, Los Altos, CA (US); Thomas J. Edsall, Los Gatos, CA (US)

(73) Assignee: Cisco Technology, Inc., San Jose, CA (US)

( * ) Notice: Subject to any disclaimer, the term of this patent is extended or adjusted under 35 U.S.C. 154(b) by 91 days.

(21) Appl. No.: 14/490,566

(22) Filed: Sep. 18, 2014

(65) Prior Publication Data
US 2015/0127900 A1 May 7, 2015

Related U.S. Application Data

(60) Provisional application No. 61/900,314, filed on Nov. 5, 2013.

(51) Int. Cl.
| | |
|---|---|
| G06F 12/00 | (2006.01) |
| G11C 15/04 | (2006.01) |
| H04L 12/707 | (2013.01) |
| H04L 12/803 | (2013.01) |
| G11C 11/4096 | (2006.01) |

(Continued)

(52) U.S. Cl.
CPC .............. *G11C 15/04* (2013.01); *H04L 45/24* (2013.01); *H04L 47/125* (2013.01); *G06F 9/30018* (2013.01); *G06K 15/107* (2013.01);

*G11C 11/4096* (2013.01); *G11C 15/00* (2013.01); *G11C 2207/002* (2013.01)

(58) Field of Classification Search
CPC .............. G11C 11/4096; G11C 15/00; G11C 2207/002; G11C 15/04; G11C 5/04; G11C 7/1006; G11C 2029/1806
USPC ......................................... 711/108; 370/235
See application file for complete search history.

(56) References Cited

U.S. PATENT DOCUMENTS

| | | |
|---|---|---|
| 8,854,972 B1 | 10/2014 | Li |
| 9,502,111 B2 | 11/2016 | Dharmapurikar et al. |

(Continued)

OTHER PUBLICATIONS

Zhang, Junjie, et al., "Optimizing Network Performance using Weighted Multipath Routing," Aug. 27, 2012, 7 pages.

*Primary Examiner* — Mardochee Chery
(74) *Attorney, Agent, or Firm* — Polsinelli PC

(57) ABSTRACT

A ternary content-addressable memory (TCAM) that is implemented based on other types of memory (e.g., SRAM) in conjunction with processing, including hashing functions. Such a H-TCAM may be used, for example, in implementation of routing equipment. A method of storing routing information on a network device, the routing information comprising a plurality of entries, each entry has a key value and a mask value, commences by identifying a plurality of groups, each group comprising a subset number of entries having a different common mask. The groups are identified by determining a subset number of entries that have a common mask value, meaning at least a portion of the mask value that is the same for all entries of the subset number of entries.

17 Claims, 10 Drawing Sheets

(51) Int. Cl.
  *G06K 15/10*    (2006.01)
  *G06F 9/30*     (2006.01)
  *G11C 15/00*    (2006.01)

(56) References Cited

U.S. PATENT DOCUMENTS

| | | | |
|---|---|---|---|
| 2011/0273987 A1* | 11/2011 | Schlansker | H04L 12/462 370/235 |
| 2012/0314581 A1 | 12/2012 | Rajamanickam et al. | |
| 2013/0064246 A1 | 3/2013 | Dharmapurikar et al. | |
| 2014/0108489 A1 | 4/2014 | Glines et al. | |
| 2014/0122791 A1* | 5/2014 | Fingerhut | H04L 49/00 711/108 |
| 2014/0185348 A1* | 7/2014 | Vattikonda | G11C 15/00 365/49.17 |
| 2014/0185349 A1* | 7/2014 | Terzioglu | G11C 15/00 365/49.17 |
| 2015/0052298 A1* | 2/2015 | Brand | G11C 15/04 711/108 |
| 2015/0124825 A1 | 5/2015 | Dharmapurikar et al. | |

* cited by examiner

| Src port type 812 | Dest port type 814 | Src port mask 816 | Dest port mask 818 | Src port value 820 | Dest port value 822 |
|---|---|---|---|---|---|
| Fully specified | Fully specified | 1111111111111111 | 1111111111111111 | S | D |
| Fully specified | Fully wildcard | 1111111111111111 | 0000000000000000 | S | 0 |
| Fully specified | Range | 1111111111111111 | 0000000000000000 | S | D_lo, D_hi |
| Fully wildcard | Fully specified | 0000000000000000 | 1111111111111111 | 0 | D |
| Fully wildcard | Fully wildcard | 0000000000000000 | 0000000000000000 | 0 | 0 |
| Fully wildcard | Range | 0000000000000000 | 0000000000000000 | 0 | D_lo, D_hi |
| Range | Fully specified | 0000000000000000 | 1111111111111111 | S_lo, S_hi | D |
| Range | Fully wildcard | 0000000000000000 | 0000000000000000 | S_lo, S_hi | 0 |
| Range | Range | 0000000000000000 | 0000000000000000 | S_lo, S_hi | D_lo, D_hi |

810 braces the mask/value columns. Arrows 831–839 point to rows.

FIG. 7

TERNARY CONTENT ADDRESSABLE MEMORY UTILIZING COMMON MASKS AND HASH LOOKUPS

CROSS REFERENCE TO RELATED APPLICATIONS

This application claims priority to U.S. Provisional Patent Application No. 61/900,314, filed Nov. 5, 2013, the content of which is incorporated herein by reference in its entirety.

TECHNICAL FIELD

The present technology pertains to content addressable memory (CAM), and more specifically pertains to implementing lookups ordinary allocated to CAM in other types of memory (e.g., SRAM) in conjunction with processing, including hashing functions.

BACKGROUND

The soaring demand for network data throughout the globe has steadily fueled the evolution of networking technologies, as engineers and manufacturers rush to keep pace with the changing data consumption landscape and increasing network scalability requirements. Various network technologies have been developed precisely to meet this soaring demand for network data.

Typically, such large-scale operations involve massive amounts of traffic data constantly being routed through the various nodes and devices in the network. As the amount of traffic handled by the network grows, it becomes increasingly important to efficiently route such traffic: poor routing strategies can create an enormous burden on the network, which only worsens as the amount of traffic grows. Efficient routing can be accomplished, in part, by identifying routing information needed to route traffic, such as endpoint-to-switch bindings or mappings in a forwarding table. This way, nodes can quickly lookup precisely where traffic needs to be directed rather than broadcasting the traffic on the network or otherwise forwarding the traffic to unnecessary devices.

Routing information has grown in size and complexity as it has become more costly and time-consuming to use the larger and more complex routing information as systems and devices become more complex. As a result of the increasing complexity, current storage and lookup mechanisms for routing information have become slow, power consuming and costly.

BRIEF DESCRIPTION OF THE DRAWINGS

In order to describe the manner in which the advantages and features of the disclosure can be obtained, a more particular description will be rendered by reference to specific embodiments thereof which are illustrated in the appended drawings. Understanding that these drawings depict only exemplary embodiments of the disclosure and are not therefore to be considered to be limiting of its scope, the principles herein are described and explained with additional specificity and detail through the use of the accompanying drawings in which:

FIG. 7 illustrates an example of port ranges;

DETAILED DESCRIPTION

Figure 1:
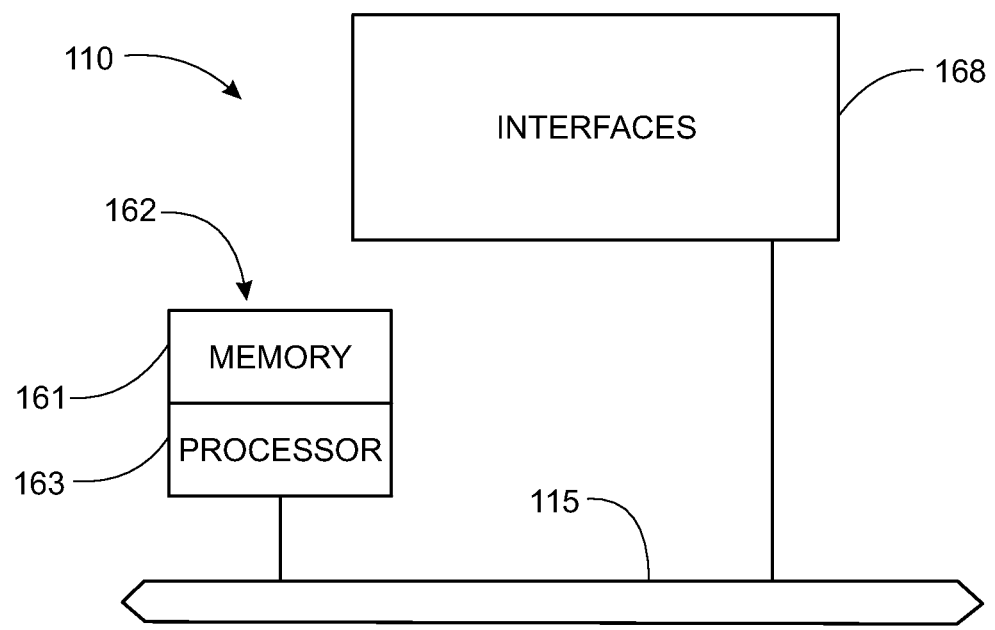
FIG. 1 illustrates an example network device, according to some aspects of the subject technology.

Various embodiments of the disclosure are discussed in detail below. While specific implementations are discussed, it should be understood that this is done for illustration purposes only. A person skilled in the relevant art will recognize that other components and configurations may be used without parting from the spirit and scope of the disclosure.

Overview

Various tables are generated and/or used in routing, such as access control lists (ACLs), quality of service (QoS) lists, routing tables or rules tables. These generally contain a plurality of values and fields associated therewith, such as source port or destination port information.

In routing equipment, for example, it may be necessary or desirable to allow for storing of large numbers of tables such as ACLs, which may correspond to large numbers of fields that require a ternary match such as Internet Protocol (IP) source address, destination address, flags, and fields that require range checks, such as source and/or destination ports and the packets associated therewith. TCAM (ternary content-addressable memory) may be useful in the implementation of the routing equipment, however this may result in needing large TCAMs. Pure TCAMs may require large chip areas and may consume large amounts of power. A TCAM is a type of memory for storing and searching on strings of data, by adding a third value (other than 0 or 1) which can be stored and searched: a "mask" value, often referred to as a "wild card" or "don't care" value. This enables TCAM to perform broader searches based on pattern matching, as opposed to binary CAM which performs exact match searches using only zero and ones. Thus, a typical TCAM entry has a key value and an associated mask value.

The disadvantages of a pure TCAM are that it may be expensive, and may consume a large amount of power and/or a large amount of area. A conventional TCAM also requires that every entry (meaning, each value stored in the TCAM) has its own mask stored with the value. It would be desirable to provide a solution to replace a pure TCAM that overcomes these disadvantages while maintaining the benefits of TCAM functionality.

The approaches set forth herein can be implemented to address the foregoing limitations, for example, by implementing TCAM with a hash-based solution that may be more power- and/or area-efficient than pure TCAMs. Such implementations may be based, in whole or in part, on the use of hashing techniques in conjunction with memory, such as random-access memory (RAM), in combination with an overflow TCAM. The result may be referred to generally as a hashing-based implementation of TCAM for memory allocation, or "H-TCAM". H-TCAM as used herein refers to the use of hashing techniques in conjunction with memory, such as SRAM, and hash-based implementations of TCAM, however does not and need not refer specifically to a "TCAM" table. Rather H-TCAM as used herein refers to a hash-based storage of entries used in routing that are designed to be stored in a TCAM table but that are stored in hash tables using a hashing function in conjunction with traditional memory. H-TCAM as used herein, thus, refers to any system or method implementing hash-based memory allocation.

Disclosed are systems, methods, devices, and non-transitory computer-readable storage media for implementing a hash-based TCAM functionality. As follows, a method of the subject technology is described with respect to a system performing steps for identifying a plurality of groups of entries, each group of entries comprising a subset of entries having a common mask and creating an array of tables that includes at least two tables, each table having a different common mask, having at least a portion of the mask value that is common to all entries in the table. The step of identifying can include: identifying a first subset of entries of the plurality of groups of entries that have a first common mask value and designating that as a first common mask. The step of identifying can further include: identifying a second subset of entries of the plurality of groups of entries that have a second common mask value and designating that as a second common mask. The step of identifying can further include: including the first subset of entries in a first table, and associating the first common mask with the first table. The step of identifying can further include: including the second subset of entries in a second table, and associating the second common mask with the second table. For locating an entry in the array of tables, the first and second tables can be searched in parallel using the key value for the entry.

A method of the subject technology can further identify among a plurality of keys, wherein each key is associated with a mask value, a first subset of the plurality of keys having a common mask value. The first subset of the plurality of keys having a first common mask value are entered into a first table stored in RAM. The first table is then associated with the first common mask value. A remaining plurality of keys that do not have a common mask value into a TCAM that includes each key and its associated mask value. A second subset of the plurality of keys having a second common mask value can be identified. The second subset of the plurality of keys having a second common mask value can be entered into a second table stored in RAM to provide two tables in RAM.

As referred to herein tables can refer to any table or index or data structure useful in storing and looking up values. In some embodiments tables further refer to hash tables, for example dleft hash tables.

Description

Figure 8:
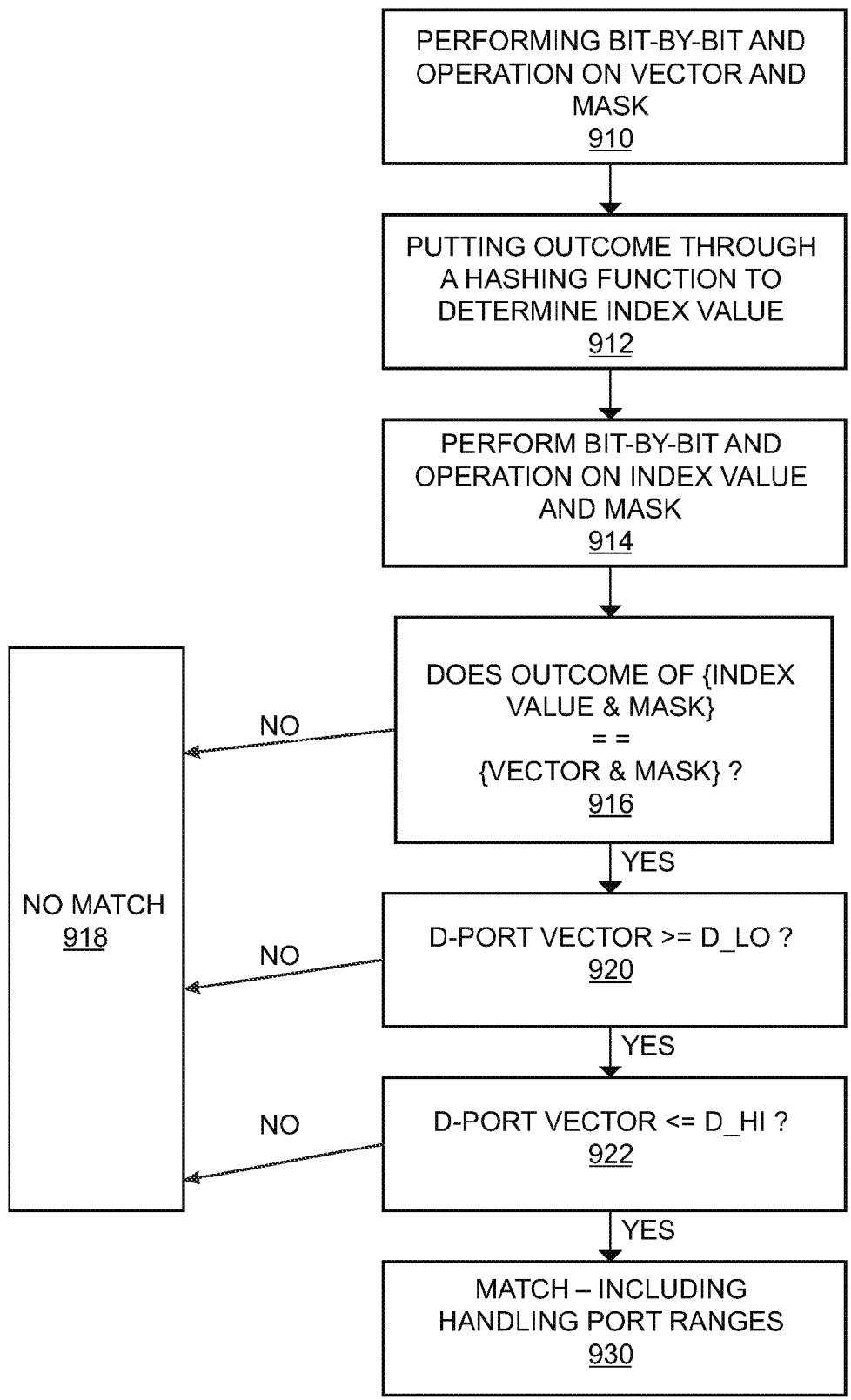
FIG. 8 is a flow chart of a lookup function implementing an embodiment of H-TCAM.

FIG. 1 shows an exemplary device supported by the technologies herein. FIGS. 2 through 5 show and describe various high-level architecture principles of the technologies herein. FIG. 6 illustrates a flow chart of a method. FIG. 7 shows exemplary port ranges. FIG. 8 illustrates a lookup method embodiment, further illustrated by FIGS. 9 and 10 which show examples of specific implementations of source port ("sport") and destination port ("dport") routing. FIG. 11 illustrates an embodiment for handling arbitrary wild cards.

Ternary content-addressable memory (TCAM) is a specialized type of high speed memory that searches its entire contents in a single clock cycle. It is commonly used in networking for implementing high performance routers and switches, to increase the speed of look-up functions, packet classification, packet forwarding, and access control list based commands.

"Ternary" refers to the memory's ability to store and query data using three different inputs: 0, 1 and X. The "X" input, often referred to as "don't care" or "wild card" state, enables TCAM to perform broader searches based on pattern matching, as opposed to binary CAM, which performs exact match searches using only zeros and ones. A "ternary" match thus searches based on pattern matching.

Content-addressable memory, common to both CAM and TCAM, is also referred to as associative memory or a hardware associative array. In contrast to random access memory (RAM), in which a user supplies a memory address and the RAM returns the data word stored at that address, a CAM is designed such that the user supplies a data word and the CAM searches its entire memory to see if that data word is stored anywhere in it. If the data word is found, the CAM returns a list of one or more storage addresses where the word was found, and in some architectures, it also returns the data word, or other associated pieces of data.

While CAM is much faster than RAM in virtually all search applications, there are cost disadvantages to CAM because each individual memory bit in a fully parallel CAM must have its own associated comparison circuit to detect a match between the stored bit and the input bit. Additionally, match outputs from each cell in the data word must be combined to yield a complete data word match signal. The additional circuitry increases the physical size of the CAM chip, increases the manufacturing costs, and increases power dissipation since every comparison circle is active on every clock cycle.

Multilayer switches forward frames and packets at wire speed using ASIC hardware. Routing, switching, ACL, and QoS tables are stored in a high-speed table memory so that forwarding decisions and restrictions can be made in high-speed hardware. Switches perform lookups in these tables for result information, such as to determine whether a packet with a specific destination IP address is supposed to be dropped according to an ACL. Typically these switches deploy memory tables using specialized memory architectures such as CAM and TCAM.

TCAM is an important component of Layer 3 switches and modern routers for storing routing tables. TCAM is most useful for building tables for searching on longest matches such as IP routing tables organized by IP prefixes. The TCAM table also stores ACL, QoS and other information generally associated with upper layer processing. Most switches have multiple TCAMs so that both inbound and outbound security, as well as QoS and ACLs can be evaluated simultaneously or entirely in parallel with a Layer 2 or Layer 3 forwarding decision.

"VMR" (value, mask and result) refers to the format of entries in TCAM. The "value" in VMR refers to the pattern that is to be matched; examples include IP addresses, protocol ports, DSCP values. The "mask" refers to the mask bits associated with the pattern and may be used to determine a subnet prefix. The "result" refers to the result or action that occurs in the case where a lookup returns a hit for the pattern and mask. The result might be a "permit" or "denied" in the case of a TCAM for ACLs, values for QoS policies in case of the QoS, or a pointer to an entry in a hardware adjacency table that contains the next top MAC information in the case of the TCAM used for IP routing.

As previously discussed, the additional circuitry of CAM and TCAM consumes high power and high area on the chip. A further problem in networking applications is the exploding sizes of TCAM tables. For example, a typical rule set for a large number of access control lists (ACLs), when mapped to classes, (e.g., S class, D class) may generate a table size on the order of 70K. When the rules specify port ranges, each port range (D port and S port) needs to be expressed as a set of prefixes to be added in TCAM. When both source port and destination port are ranges, the result is a cross product of the prefixes generated by both ranges. Thus, the 70K rule set may almost double after range to prefix conversion.

One method for handling port ranges is to do a prelookup on the range using comparators, and use a label in the actual ACL. However, the ranges can overlap, which expands the number of TCAM entries for the original rules, as many ranges need to be expressed as several labels. In the prior example, expressing ranges as a set of labels may increase the TCAM range to 370K (from the original 70K rules). In addition, managing range labels is difficult, as every incremental update can change the labels, requiring more updates. This can quickly result in an enormously large TCAM table.

Thus, it would be desirable to provide an improved implementation of TCAM memory allocation to alleviate some of the prior problems with using conventional TCAM and TCAM tables for network switching and routing.

The disclosed technology addresses the need in the art for more efficient processing of routing information, including the need for more power- and/or area-efficient implementations of TCAM that may also address some of the problems, e.g., rule-set expansion, encountered in previous approaches. Disclosed are systems, methods, devices, and computer-readable storage media for implementations of hash-based ternary content-addressable memory (hash-based TCAM or H-TCAM). One application of H-TCAM, as noted herein, is implementing and storing routing information for routing equipment. Although not limited to this application, the discussion below will use routing-oriented examples to illustrate examples of TCAM implementations. A brief introductory description of exemplary systems and networks, as illustrated in FIG. 1, is disclosed herein. A detailed description of various embodiments implementing H-TCAM, related concepts, and exemplary variations, will then follow.

FIG. 1 illustrates an exemplary network device 110 suitable for implementing the present disclosure. Network device 110 includes a master central processing unit (CPU) 162, interfaces 168, and a bus 115 (e.g., a PCI bus). The bus 115 can comprise a CPI bus, a connectivity on a system or a pathway on a network (such as an overlay network), or more generally element 115 can be used to broadly designate a network, including a LAN, WAN, VXLAN, NVGRE, STT, overlay network, or other appropriate system. When acting under the control of appropriate software or firmware, the CPU 162 is responsible for executing packet management, error detection, and/or routing functions, such as miscabling detection functions, for example. The CPU 162 preferably accomplishes all these functions under the control of software including an operating system and any appropriate applications software. CPU 162 may include one or more processors 163 such as a processor from the Motorola family of microprocessors or the MIPS family of microprocessors.

In some embodiments, processor 163 is specially designed hardware for controlling the operations of router 110. In some embodiments, a memory 161 (such as non-volatile RAM and/or ROM or TCAM) also forms part of CPU 162. However, there are many different ways in which memory could be coupled to the system.

The interfaces 168 are typically provided as interface cards (sometimes referred to as "line cards"). Generally, they control the sending and receiving of data packets over the network and sometimes support other peripherals used with the router 110. Among the interfaces that may be provided are Ethernet interfaces, frame relay interfaces, cable interfaces, DSL interfaces, token ring interfaces, and the like. In addition, various very high-speed interfaces may be provided such as fast token ring interfaces, wireless interfaces, Ethernet interfaces, Gigabit Ethernet interfaces, ATM interfaces, HSSI interfaces, POS interfaces, FDDI interfaces and the like. Generally, these interfaces may include ports appropriate for communication with the appropriate media. In some cases, they may also include an independent processor and, in some instances, volatile RAM. The independent processors may control such communications intensive tasks as packet switching, media control and management. By providing separate processors for the communications intensive tasks, these interfaces allow the master microprocessor 162 to efficiently perform routing computations, network diagnostics, security functions, etc.

Although the system shown in FIG. 1 is one specific network device of the present disclosure, it is by no means the only network device architecture on which the present disclosure can be implemented. For example, an architecture having a single processor that handles communications as well as routing computations, etc. is often used. Further, other types of interfaces and media could also be used with the router.

Regardless of the network device's configuration, it may employ one or more memories or memory modules (including memory 161) configured to store program instructions for the general-purpose network operations and mechanisms for roaming, route optimization and routing functions described herein. The program instructions may control the operation of an operating system and/or one or more applications, for example. The memory or memories may also be configured to store tables such as mobility binding, registration, and association tables, etc.

An array of tables can be generated, stored and accessed by the processor 163, in accordance with teachings described in greater detail hereinbelow. In some embodiments, the tables can also be stored directly in memory 161. The table can be stored and accessed by a device, such as a switch. The tables can include entries for an ACL, a QoS list, a rules table or a routing table, or any combination thereof.

Overview of Hashed-Based Allocation of TCAM (H-TCAM)

FIGS. 2-5 provide an overview of an embodiment for a system and method for implementing a hash-based allocation of TCAM (H-TCAM).

Figure 2:
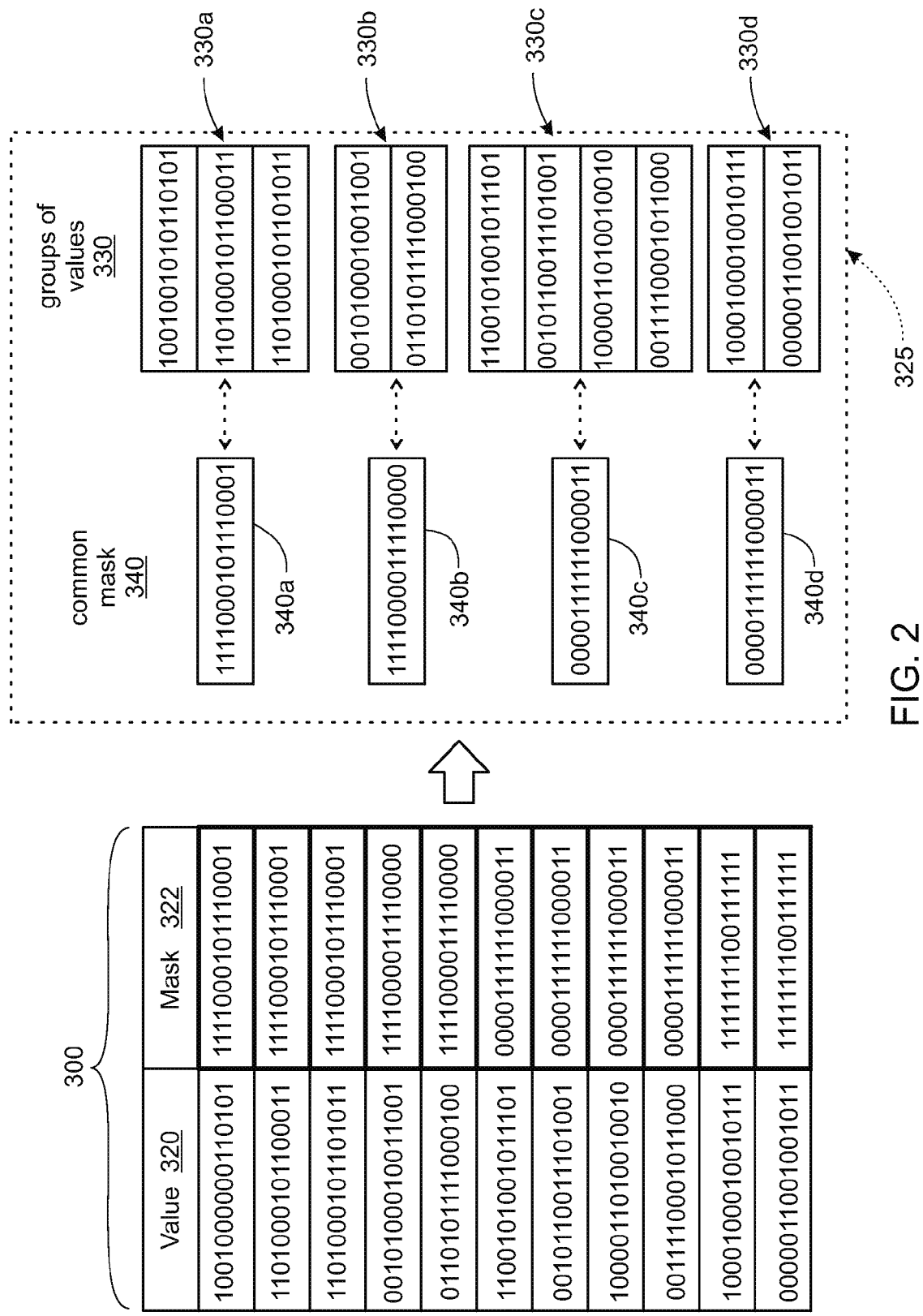
FIG. 2 is an example embodiment showing the grouping of TCAM entries having a common mask value to generate tables.

FIG. 2 illustrates a step of identifying a plurality of entries 300, each entry in the table having a key value 320 and a mask value 322. The key value 320 may include a string of bits that comprises a number of fields, some requiring a ternary match, for example an IP (source or destination) address, and some requiring a range check, for example a port number. The mask values 322 are evaluated to identify a plurality of groups of entries, each group of entries comprising a subset of entries having a common mask for each group of entries having the same mask (or at least a portion thereof) in common. In this example, the first three entries have a common mask value 340*a*, the next two entries have a common mask value 340*b*, the next four entries have a common mask value 340*c*, and the final two entries have a common mask value 340*d*. As a result of this grouping, the values 320 are shown in the far right column as groups of values 330 grouped according to their respective common mask, wherein the first group of three values 330*a* have a common mask 340*a*, similarly, entries 330*b* have a common mask 340*b*, entries 330*c* have a common mask 340*c*, and entries 330*d* have a common mask 340*d*.

Figure 3:
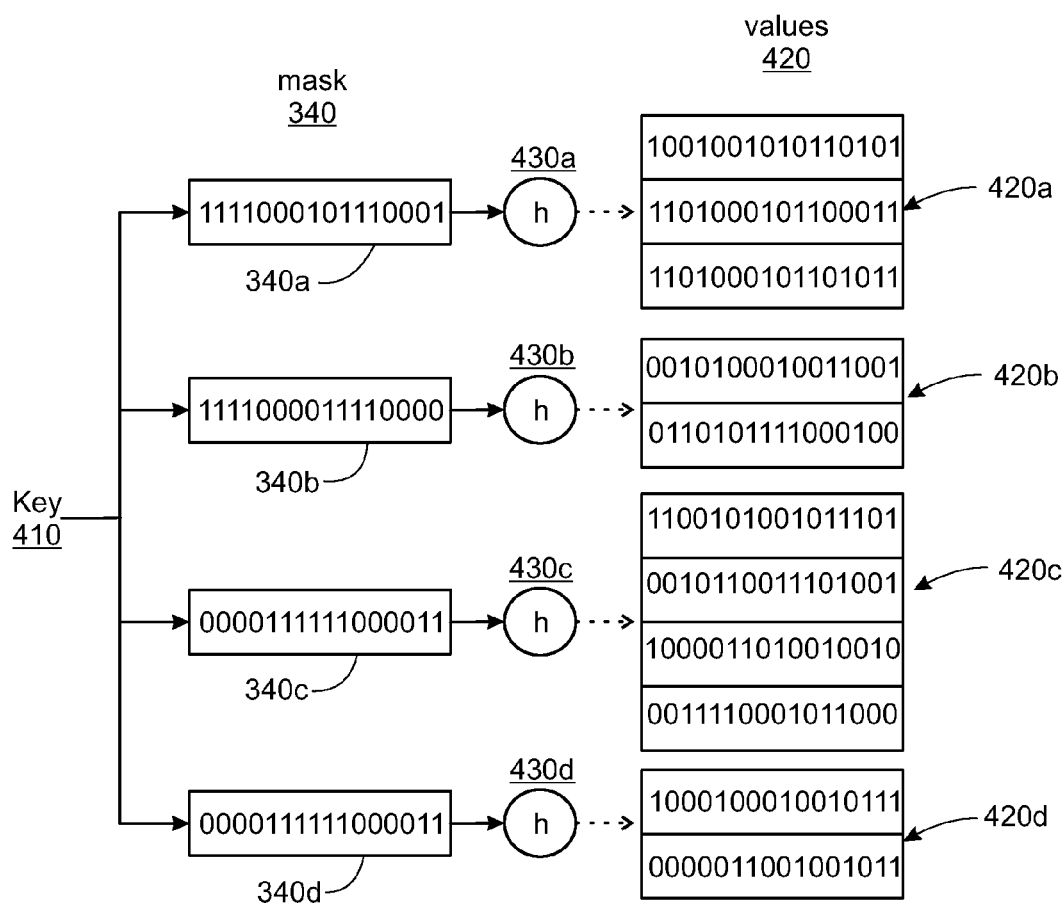
FIG. 3 is an example embodiment showing an application of a key value to the common mask values when performing a lookup function.

Utilizing the groupings of values and associated common masks from FIG. 2, FIG. 3 illustrates a new H-TCAM method and system for storing and/or searching a hash-based implementation of a TCAM table based on the common mask values. A key 410, used to perform a lookup, is now applied to each of the common masks 340, here represented as 340*a*, 340*b*, 340*c*, and 340*d*, in a first AND operation (i.e., the common mask and the key are bitwise ANDed) to determine if there is a match between the common mask ANDed with the key 410 and the common mask ANDed with the entry in the table. As described further below, the common mask is common to an entire table of values. Each common mask has a different associated table for searching the values associated with the respective common mask.

The plurality of tables is thus capable of being searched in parallel, so there is no need to store the mask value with each key entry. The mask is stored outside of the table stored in TCAM, but operatively connected thereto, for example as a set of flip flops. In FIG. 3, the common mask 340*a*, 340*b*, 340*c*, 340*d* is bitwise ANDed with the key 410 and processed using a hashing function 430 which provides an index to the entries (values 420*a*, 420*b*, 420*c*, 420*d*, respectively) in a table.

There are numerous advantages to the hash-based lookup illustrated schematically in FIG. 3. By grouping the values having a common mask each common mask value provides a smaller number of values in the table that are more likely to match, based on the common mask. Lookups can now be done using a hash within the group of entries with the same common mask. Lookups can also be done on each table in the plurality of tables at the same time to significantly reduce processing time, as compared with conventional TCAM tables which require lookup on the entire large table to search for an entry. The plurality of tables further reduces the memory requirement as it is not required to store the mask per entry—the entire set of entries for each table has a single common mask. Thus, both the memory size and processing speed of the TCAM is improved by the use of hash-based TCAM.

Figure 4:
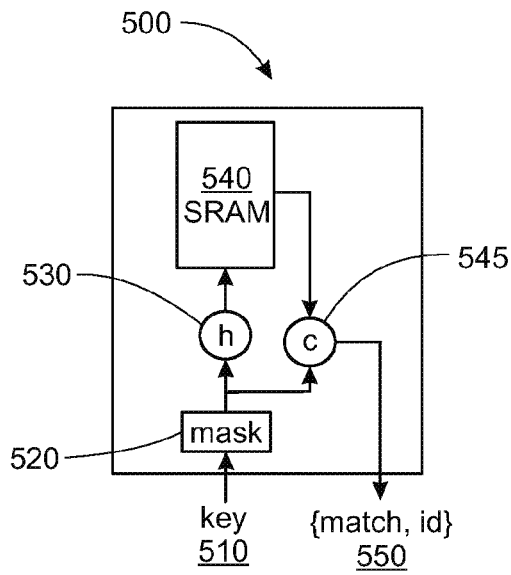
FIG. 4 is an example architecture of implementing H-TCAM.
Figure 5:
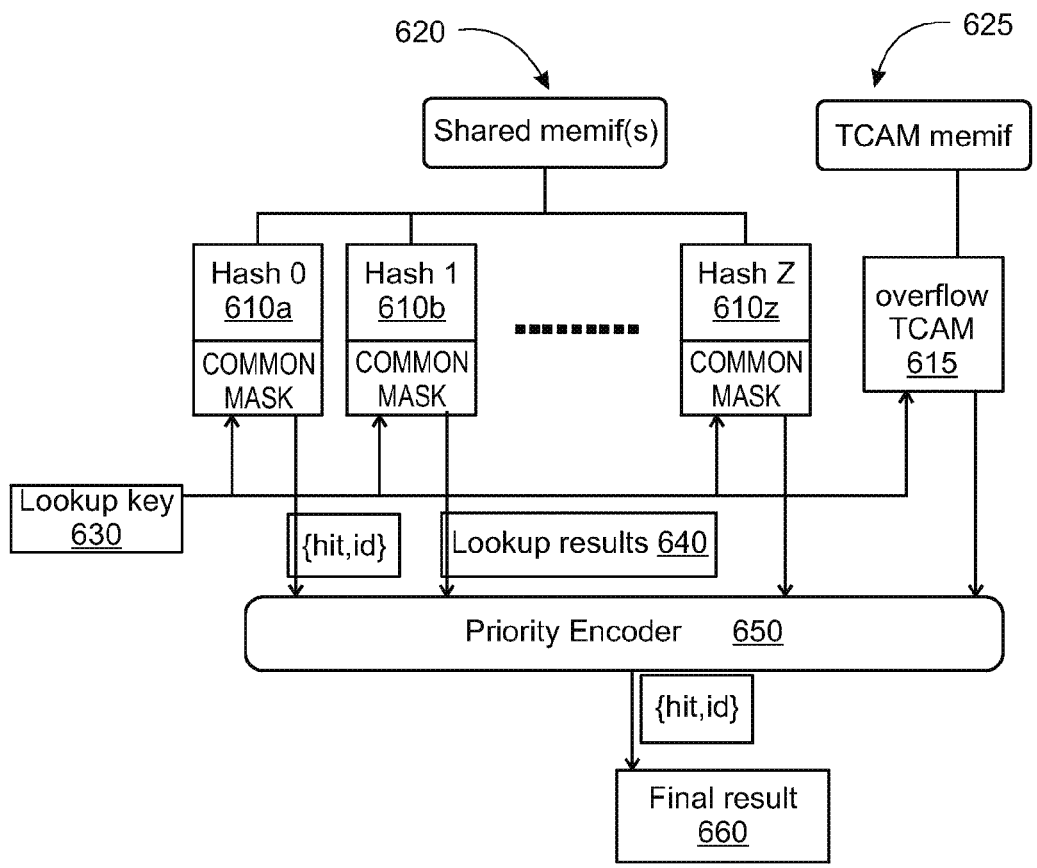
FIG. 5 is an example architecture for implementing H-TCAM and comprising an array of tables and a small overflow TCAM.
Figure 6:
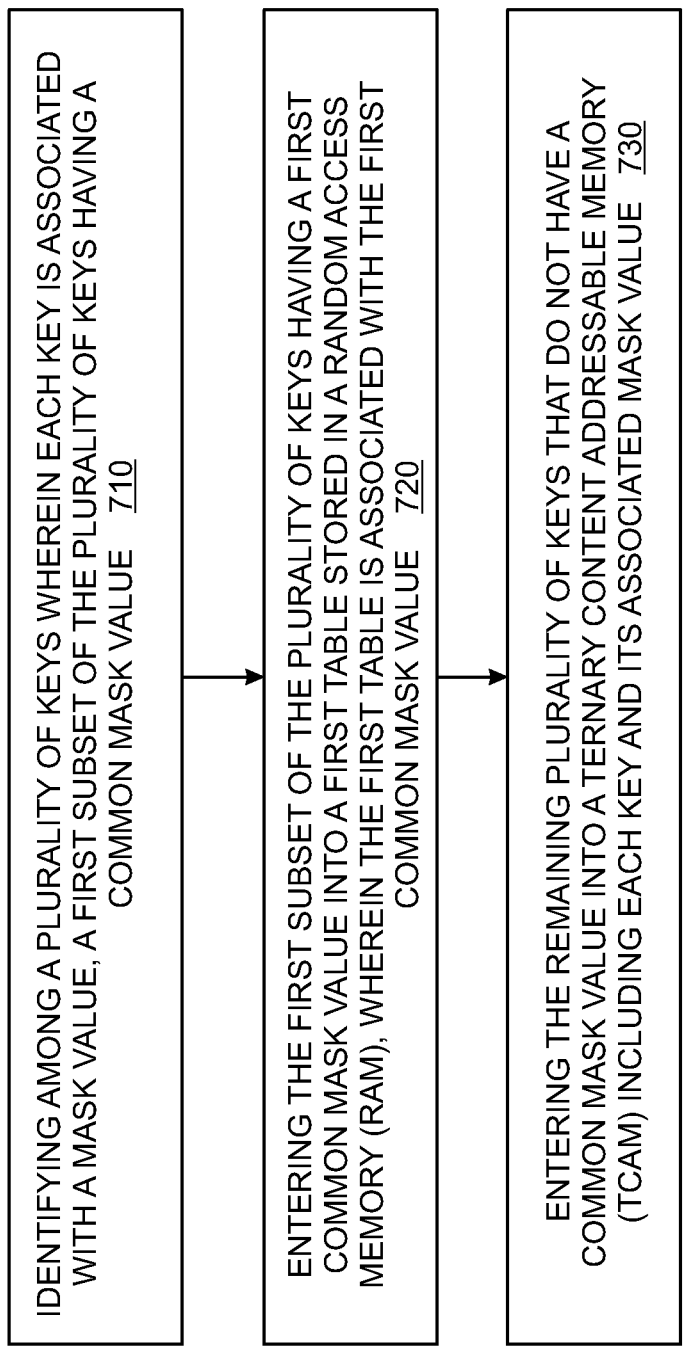
FIG. 6 is a flow chart for implementing an embodiment of H-TCAM.

FIGS. 4-5 illustrate various embodiments of an H-TCAM system and method. FIG. 4 is a schematic illustration of an H-TCAM lookup process where the tables are stored in SRAM (static RAM) memory 540. An input key 510 is applied to determine if there are any matches in SRAM 540. The hash function gives us a value in the table. It is determined if the key ANDED with the mask matches the entry ANDED with the mask. If there is a hit, it is returned at 550 as a {match, ID} pair.

FIG. 5 illustrates a plurality of tables for use in storing entries for routing information and performing a lookup of an entry. In accordance with some embodiments of H-TCAM, each of the tables has its common mask for increasing the efficiency of the H-TCAM operations and memory allocation. In FIG. 5, a key 630 is applied and each table, designated 610*a*, 610*b* . . . 610*z*, is searched in parallel, each of which has a different associated common mask that is unique to each table, which isn't stored directly in the table. Instead the common mask is stored in RAM with a reference to its associated table (one of 610*a* . . . , 610*z*). The output values from each of the respective table operations are labeled as lookup results 640. The results are fed to a priority resolution component 650 which selects among the respective results, for example based upon a priority identifier as part of the key value stored in each table, to identify a single {match, ID} 650. In some embodiments, the tables can be dleft hash tables.

The H-TCAM architecture of FIG. 5 includes, in addition to the array of tables, a small overall TCAM 615 to handle hash overflows or minority outliers (e.g., potential TCAM entries that did not have a common mask with enough other entries or having an unconventional format). Preferred methods of determining an associated common mask (or at least a portion thereof) for each of the tables, as well as determining such minority outliers and overflows, are described below.

The H-TCAM architecture can be used, for example, for grouping rules of an access control list by identifying a common mask for multiple rule entries within the set. A lookup can then be done using a hash within the set. This reduces the memory requirement as it is not necessary to store the common mask per entry in a TCAM table, as the entire set has a single mask.

The groups formed may be of different sizes, and thus it would be desirable to provide a flexible way to allocate memory to each set. For certain masks, the rule set might be large, whereas for other rule sets the group may be very small. Methods are described below for configuring the common masks to better allocate the memory to each set.

Example: H-TCAM Implemented Using SRAM

As a further descriptive and more detailed example, assume that one would like to implement a W-bit wide TCAM with N entries using another type of memory, for example, but not limited to, SRAM. Suppose, for example, that N=64K and W=130 bits. Then the following example techniques may be used as a basis for obtaining and using an implementation of TCAM entries as illustrated in FIG. 5:

1) Let k be a TCAM key and m be a mask.
2) An input vector v matches this key if v & m==k & m, where "&" represents a bit-by-bit AND operation.
3) Split the TCAM key into two parts, k={kA, kB}, and let the corresponding parts of the mask be split as m={mA, mB}.
4) Split the input vector, accordingly, as v={vA, vB}.
5) Now the input vector matches a key if (vA & mA==kA & mA) && (vB & mB==kB & mB), where "&&" is a logical-AND of two conditions.
6) Examine how many unique values of mA are seen in the set of TCAM entries (e.g., rules). As an illustrative example, to which the present technology is not limited, assume that the number of unique values of mA does not exceed 64. Note that the bit positions in the TCAM entry may be swizzled such that the bit positions that form mA create fewer values of mA.
7) Create 64 dLeft hash tables, each with 1K entries, for example. Let this arrangement be 4-way set-associative. As a result, there may be two banks, each bank with two columns and 256 rows.
8) Associate a unique mA with a bank as a common mask g.
9) To store or lookup a key in a hash table, one may first mask the first part of the key with the common mask.

10) The actual entry in the hash table is h={kA, kB, mB, id}, where kA is the key and {kB, mB, id} is the associated data with the key. Note that mA need not be in the entry because it was put in the common mask g of this hash table because it is common to all the rules in this hash table. Note that mB thus becomes the "local" mask (meaning, the portion of the mask that is not common) for the actual entry with which it is associated.

11) id may represent an actual TCAM entry ID used for prioritization. A larger value of id may correspond to a higher priority.

12) Conceptually, the lookup gives a hit if (vA & g==kA) && (vB & mB==kB & mB).

13) This may be implemented, for example, as follows:

```
o  addr ← hash(g & vA)
o  row0 ← bank0[addr]
o  row1 ← bank1[addr]
o  match = false; match_id = −1;
o  for (i=0; i < 2; i++) {
      ■ if ((row0.entry[i].kA == vA & g) &&
      ■   (row0.entry[i].kB & row0.entry[i].mB == vB &
      ■   row0.entry[i].mB)) match = true;
      ■ if (match && row0.entry[i].id > match_id) match_id =
        row0.entry[i].id;
o  }
o  for (i=0; i < 2; i++) {
      ■ if ((row1.entry[i].kA == vA & g) &&
      ■   (row1.entry[i].kB & row1.entry[i].mB == vB &
      ■   row1.entry[i].mB)) match = true;
      ■ if (match && row1.entry[i].id > match_id) match_id =
        row1.entry[i].id;
o  }
o  Return {match, match_id}
```

Splitting the key into two parts can be done bitwise, for example, so that if the key value contains 100 bits and the mask value likewise contains 100 bits, the key kA could contain 75 bits, mask mA would likewise contain 75 bits, and the remaining key kB would be 25 bits and remaining mask mB would contain 25 bits. Any split is appropriate in accordance with the teachings herein to provide any number of bits in the mask that are common to other TCAM entries to be designated as the common mask for a group of entries.

This lookup may be performed in all the 64 hash tables in parallel. Each may apply its associated common mask on the vA and perform the lookup. 64 results may thus be generated.

Compare the match_h ids (as shown in the above pseudo-code) of all the matches in the 64 results, and pick the result having the largest associated id. The priority encoder (for example 650 of FIG. 5) can similarly choose the result based upon its value in id for example.

A further possibility is that there may be multiple keys with the same {kA, mA} but different {kB, mB}. All such keys may thus land in the same hash row. However, in one example according to the exemplary diagram of FIG. 5, only four may be accommodated in one hash table. If there are more tables with the same common mask, then the colliding entries can be spread out into the other tables having the same common mask. If they do not fit the tables with same common mask, they can be pushed to the overflowing tables in the TCAM.

In the above example, in order to accommodate these possibilities, a 4K overflow TCAM can be used. Again, the present technology is not limited to the above example, and other sizes are possible.

It is also possible that there are two rules where all the fields are the same but have different port ranges. For example, everything may be the same for both rules, but the destination ports may have different ranges of values. But there may only be space to store one range. In such a case, one of the rules may be moved to another bank having the same mask. This is facilitated, e.g., by the existence of the N-way set-associative structure. Hence, such colliding rules may fit into one of the allocated banks. And, again, if this is not possible, one of the colliding rules may be pushed into overflow TCAM; however, this may generally seldom occur.

Analyzing TCAM Entries to Select Common Masks

To increase efficiency of the H-TCAM process according to one embodiment, the TCAM entries are analyzed and the bit positions are carefully decided such that the fewest common masks are selected that cover the largest number of entries.

There can be an implicit assumption that the TCAM rules of all the users exhibit the same pattern and that once the fields that form kA and kB are fixed, they cannot be changed. This need not be so, however. For instance, some users might need arbitrary wildcard bits in misc0 instead of misc1. Or there might be hierarchical class labeling that may use longest prefix match. Or the classes may be overloaded with IP addresses. Therefore, some flexibility in remapping the fields that form kA and kB can be included. To make the design more generic, one may add a field mapping table or bit swizzle logic before feeding the key to the H-TCAM. This need not be more complicated than a set of W multiplexers, each W:1, where W is the width of the key. A key is typically in a specific format, such as {destination IP address, source IP address, etc.}. Accordingly, by swizzling the bits in the key and extracting the bits, more entries can be identified that have the common mask. The table will tell you that the bits have been swizzled and that if they key comes in, move the bits around because this bit position is the common mask. Thus, the number of entries per table can be maximized, thereby reducing the total number of tables needed for storing the entries.

It may not be necessary to implement a 4-way hash (such as a dleft hash table as in the above example) as a bank. The four columns may be broken up and implemented in four separate 1-way hash tables, each with its own common mask. Note that if the SRAM macros being used are 1-way wide, one may not incur any extra area overhead by doing this. This would result in 256 independent 1-way hash tables, and therefore, 256 different common mask patterns may be supported. There may be some additional computational burden to implement the mask for each table and the hash functions. But this may be used to provide finer granularity of allocation of RAMs. Given 256 units, an any-which way hash can be created by allocating a multiple units to use the same common mask. Therefore, the possibility of overflow may be reduced.

It may be possible to implement additional improvements to handle overflow. For example, if there is a set of keys which have the same {kA, mA} but several {kB, mB} associated with them, then instead of keeping a {kB, mB} as the associated data, a pointer to a location in a separate overflow RAM can be used. The RAM can be, for example, 1K deep and 16 entries wide. Each entry may be used to store the {kB, mB} pairs associated with the a given kA.

To handle port ranges and exact port values, another small table may be used to look up the port value and get a label. This table may have a small SRAM table (e.g., 1K) and, e.g., 256 range check values. Overlapping ranges may be broken into smaller ranges to make them mutually exclusive. A port value may be looked up in both the SRAM using hash and just compared against high and low values in the range checker. Due to mutual exclusion, this may result in only one hit, either in SRAM or TCAM. This hit will return a label as well. One may use a table for source port values and another one for destination port values. The labels may then be used in the key instead of exact port values.

However, when labels are used for mutually exclusive port ranges, certain rules may need to be replicated, which may cause significant rule set expansion in a traditional TCAM. Consider the following example:

a) Original rule1: SC=A, DC=B, SP=[2:6], DP=[4:8].
b) Original rule2: SC=X, DC=Y, SP=[4:7], DP=[5:7].
c) Note that there are two SP ranges: [2:6] and [4:7], which overlap.
d) Make the SP ranges mutually exclusive, and label them: 0=[2:3], 1=[4:6], 2=[7].
e) There are two DP ranges: [4:8] and [5:7], which overlap.
f) Make the DP ranges mutually exclusive, and label them: 0=[4], 1=[5:7], 2=[6:8].
g) Now the original rules need to expressed as:
Rule 1a: SC=A, DC=B, SP=0, DP=0
Rule 1b: SC=A, DC=B, SP=0, DP=1
Rule 1c: SC=A, DC=B, SP=0, DP=2
Rule 1a: SC=A, DC=B, SP=1, DP=0
Rule 1b: SC=A, DC=B, SP=1, DP=1
Rule 1c: SC=A, DC=B, SP=1, DP=2
Rule 2a: SC=X, DC=Y, SP=1, DP=1
Rule 2a: SC=X, DC=Y, SP=2, DP=1
h) As can be seen, the rule-set becomes bigger due to cross-products.
i) Instead of using range labels, express the rule with range of range labels.
j) For instance, the SP range [2:6] may become SP label [0:1], and range [4:7] may become [1:2].
k) The DP range [4:8] may become DP label range [0:2], and [5:7] may become [1].
l) When the original ranges are expressed as label ranges, the result is label compression.
m) Now these label ranges can be expressed as prefixes, and the rules can be programmed with SP and DP labels being prefixes, with everything else as is.
n) Because SP and DP labels are prefixes, it is possible to generate some more mask patterns, but most likely fewer than the ones that would be generated if ranges were converted to prefixes directly.

Furthermore, one may typically implement multiple hash functions for a bank and may have a configuration to choose one to use. Given 256 units, the multiple hash functions can be expensive. A cheaper way to get another hash function from the first one may be to XOR ("exclusively OR") the first hash value with a random constant. The collision characteristics of the resultant function may be about the same as the first. This can be demonstrated with experiments over sequential and random input values.

Reference is now made to FIG. 6, which is a flow chart of a method for H-TCAM according to an exemplary embodiment. The first method step at 710 is identifying among a plurality of keys, wherein each key is associated with a mask value, a first subset of the plurality of keys having a common mask value. At 720, the first subset of the plurality of keys having a first common mask value are entered into a first table stored in RAM. The first table is associated with the first common mask value at 720. This mask value (which can be all of the mask value or a portion thereof for each entry) that is common to all masks corresponding to keys in the first subset of keys is designated as the common mask. At 730, a remaining plurality of keys that do not have a common mask value are entered into a TCAM including each key and its associated mask value. Steps 710 and 720 can be performed for any number of common mask values to identify subsets of the plurality of keys that share a common mask and can be grouped together into tables. Although only two tables and associated common mask values are described, this is for illustrative purposes only and to aid in simplification for describing the H-TCAM systems and methods herein. It should be clear to those skilled in the art that an array of any number of tables, including two or more tables, that are created and searched in parallel for storing and looking up entries in routing equipment such as a network device.

Handling Port Ranges

Figure 9:
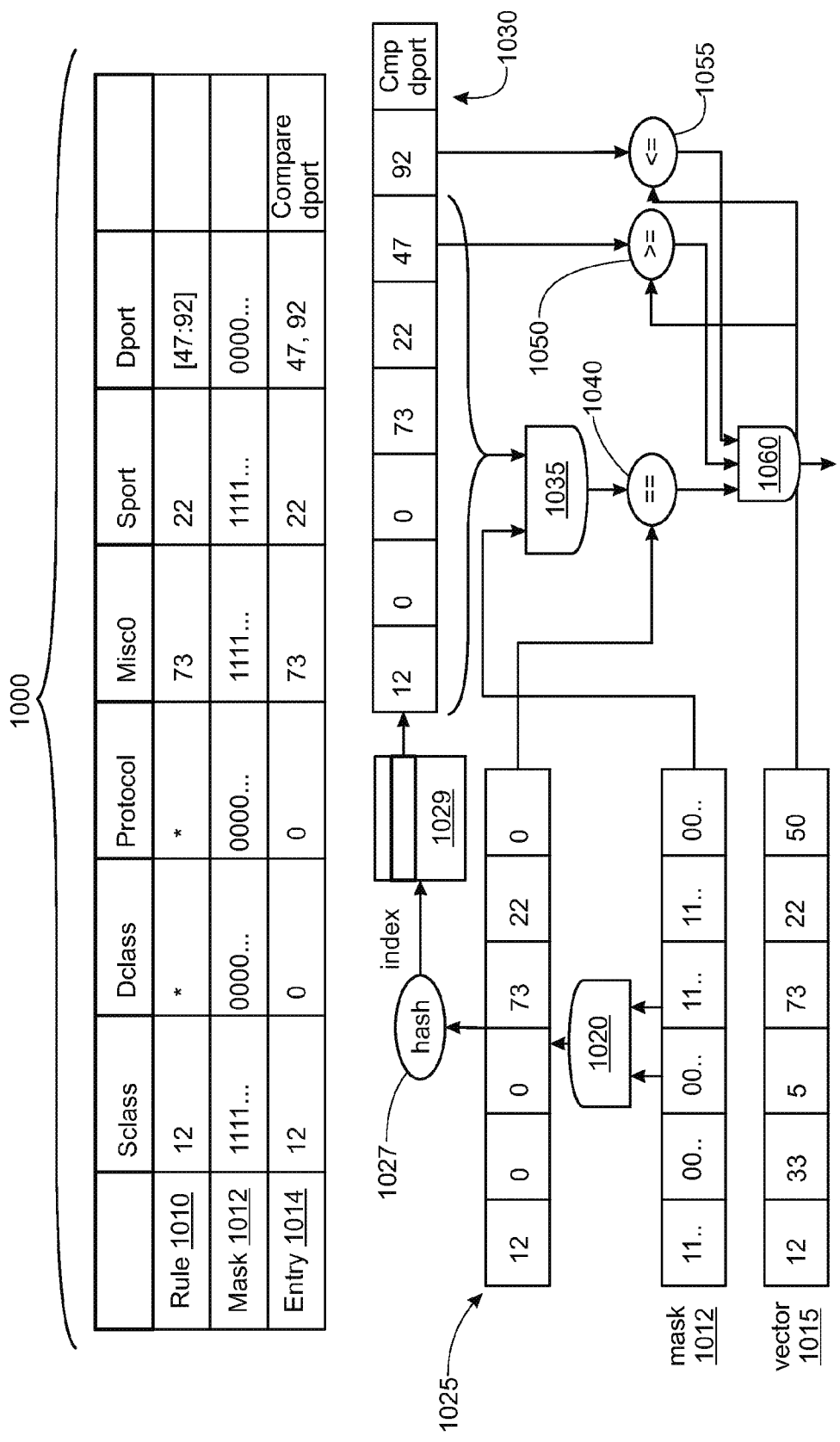
FIG. 9 illustrates an example of addressing destination port ranges using H-TCAM.

Reference is now made to FIGS. 7-10 showing examples of implementing H-TCAM including handling a port range (source port "sport" and/or destination port "dport"). FIG. 9 describes a dport (destination port) lookup function and FIG. 10 describes a sport (source port) lookup function. It should be apparent to those ordinarily skilled in the art that the tables and associated lookup functions are readily applicable to all port, address, rule, and/or device lookup functions and likewise a variety of tables, depending upon the particular application and/or table that is employed, including but not limited to ACLs, quality of service lists, routing table or rules table.

FIG. 7 shows a table 810 of different cases of port ranges that may arise in routing equipment, for source and destination ports. As shown, either port may be fully specified, provided as a range, or be a wildcard, and the various combinations are shown. Examples of corresponding masks and port values are shown for the various combinations, as well. More specifically, the source port type ("src port type") 812 can be fully specified, as in lines 831, 832, 833; the source port type 812 can be fully wildcarded as in lines 834-836; or the source type can be provided as a range as shown in lines 837, 838 and 839. Likewise, the destination port type ("dest port type") 814 can be fully specified, as shown in lines 831, 834 and 837; the destination port type can be fully wildcarded as shown in lines 832, 835 and 838; or the destination port type can be provided as a range as shown in lines 833, 836 and 839. The respective source port masks 816, destination port masks 818 and source port values 820, destination port values 822 are shown. By using such techniques, range-to-prefix conversion, and thus, rule-set expansion, may be reduced or avoided. The use of such techniques is shown and described in greater detail herein below with reference to the flow chart of FIG. 8 and the examples of FIGS. 9 and 10.

FIG. 8 is a flow chart of a lookup function implementing a H-TCAM table functionality with hash-based memory, according to one embodiment. Reference is also concurrently made to FIG. 9 showing a diagram of the lookup function implementing a rule that addresses handling destination port ranges. A table 1000 includes a rule 1010, a mask 1012 and an entry 1014. An entry vector 1015 is evaluated in accordance with the embodiments herein to determine if it is a match (meaning, it is contained within the valid port range and otherwise meets the rule).

Referring back to FIG. 8, at 910, a bit-by-bit AND operation is performed on the vector and the mask (see AND operation 1020 in FIG. 9). The resulting value (1025 in FIG. 9) is put through a hashing function (1027 in FIG. 9) to determine an index value at 912 in FIG. 8 (index 1028 in FIG. 9). A bit-by-bit AND operation of the index value and the mask is performed at 914 (see AND operation 1035 in FIG. 9). At 916, if the outcome of the first AND operation (1020; {vector & mask}, where "&" represents a bit-by-bit AND operation) and the second AND operation (1035; {index value & mask}) matches (1040 in FIG. 9, denoted by the "=" symbol indicating a match or a true condition), then the lookup procedure continues. If the outcome does not match, then there is no match found at 918. At 920 and 922 the lookup function accounts for port ranges. At 920 in FIG. 8 (1050 FIG. 9), the dport vector is evaluated to determine if this value is greater than or equal to the "D_LO" value, meaning the lowest value in the dport range [47:92] (the entry for rule 1010 under the heading dport in table 1000). If the vector is greater than or equal to D_LO (1050 in FIG. 9), then the lookup function continues on to 922. If not, then there is not a complete match because the dport value is not contained within the acceptable dport range for the table. If the dport value is greater than the low end of the range, then at 922 the dport value is evaluated to determine if it is less than or equal to the high value (D_HI) in the rule for the dport range (1055 in FIG. 9). If the outcome of 926, 920 and 922 all are true or "match" (denoted as an AND operation 1060 in FIG. 9), then at 930 there is a complete match, including handling the port ranges.

Figure 10:
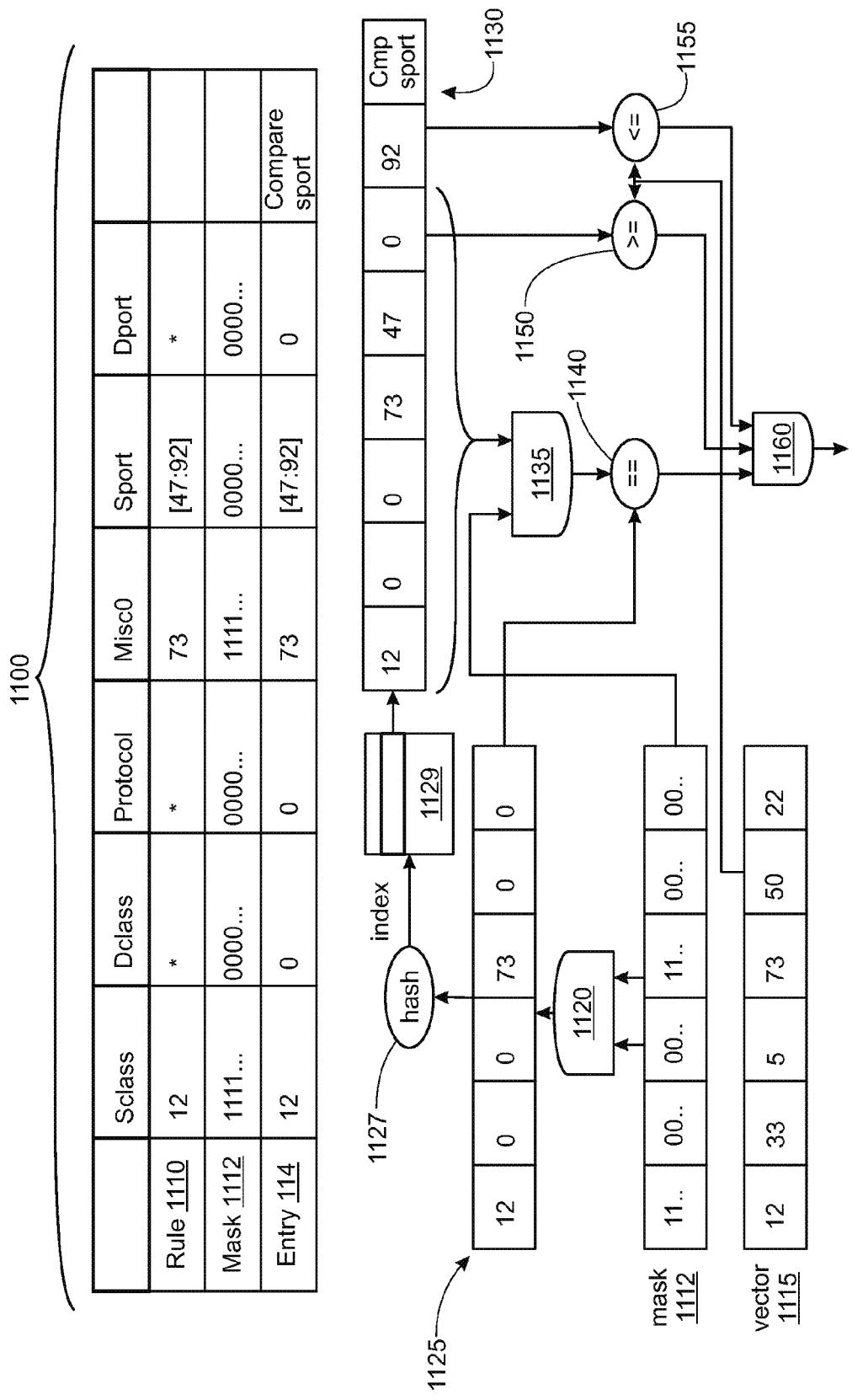
FIG. 10 illustrates an example of addressing source port ranges using H-TCAM.
Figure 11:
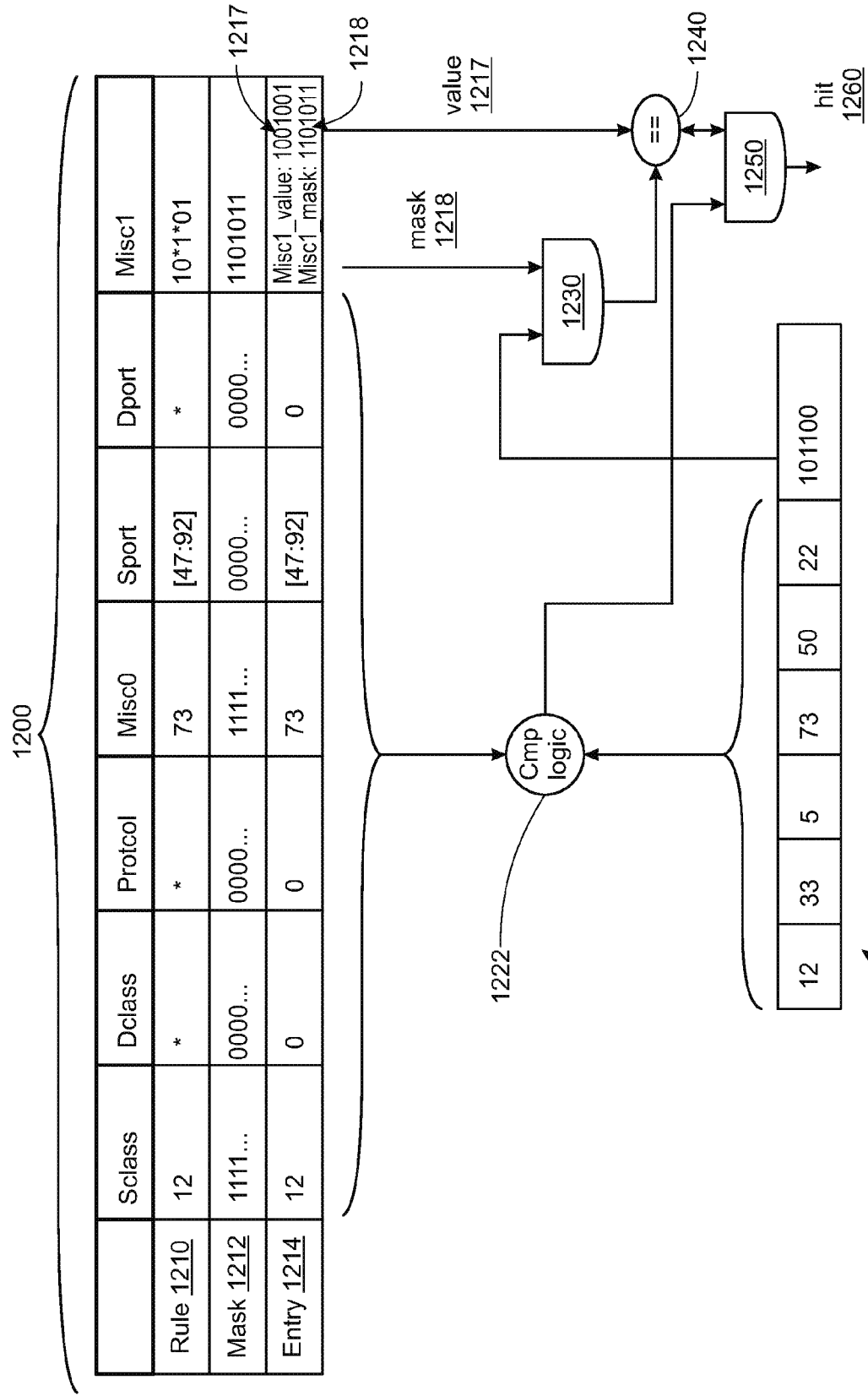
FIG. 11 illustrates an example of how arbitrary wildcards may be addressed using H-TCAM.

FIG. 10 shows an exemplary diagram for handling port ranges implementing a compare sport (source port) values. The table 1100 includes, for example, a rule 1110, a mask 1112 and an entry 1114. The vector 1115 is ANDed with the mask 1112 by a bit-by-bit AND operation at 1120. The outcome is put through a hashing function 1127 to determine an index value 1130. If the outcome of the first AND operation (index value & mask) match the outcome of the vector ANDed with the mask (at 1140), then the port range is verified to ensure a complete match. Determine if the low value of the source port range is greater than or equal to the index value (1150) and determine if the high value of the source port range is greater than or equal to the index value (1155). At 1160, if all conditions are true (1140, 1150 and 1155), then a match is returned.

Isolating Fields

In some routing equipment, for example, and/or in other scenarios, it may be possible to isolate certain fields, and keeping with rules may reduce the overall masks needed. For example, as shown in the example of FIG. 11, the Misc1 field of the table 1200 may be isolated. This may result in a need to extend the memory (e.g., by a few more bits) in order to store the misc1_mask 1218 (16 bits in FIG. 11). Consider a scenario similar to that discussed above, namely, that there are two rules that differ only in the Misc1 field. Again, another bank may be allocated to store one of the rules, by the same reasoning above, and again, as a fallback position, the TCAM may be used.

In this embodiment, both the value 1217 and the mask 1218 are kept with the entry 1214 to mask and match the mask part 1218 of the entry. If the vector ANDed with the mask matches the value at 1240, then the outcome is ANDed with computer logic 1222, and a match indicates a hit, which is returned at 1260.

In general, one may wish to analyze the TCAM entries for the overall H-TCAM to decide bit positions so that a minimum number of common masks may cover a maximum number of entries. While an optimal solution may be possible using, e.g., graph theory, an approximate solution may be possible to find based on the natures of the fields in the entries (e.g., ACLs).

The advantages of implementing a ternary content-addressable table in accordance with the teachings herein should be readily apparent to those having ordinary skill in the art. The reduced power consumption and reduced chip size area, improved efficiency, and other advantages should be apparent or at least readily ascertained from the teachings herein combined with ordinary skill in the art.

For clarity of explanation, in some instances the present technology may be presented as including individual functional blocks including functional blocks comprising devices, device components, steps or routines in a method embodied in software, or combinations of hardware and software.

Although a variety of examples and other information was used to explain aspects within the scope of the appended claims, no limitation of the claims should be implied based on particular features or arrangements in such examples, as one of ordinary skill would be able to use these examples to derive a wide variety of implementations. Further and although some subject matter may have been described in language specific to examples of structural features and/or method steps, it is to be understood that the subject matter defined in the appended claims is not necessarily limited to these described features or acts. For example, such functionality can be distributed differently or performed in components other than those identified herein. Rather, the described features and steps are disclosed as examples of components of systems and methods within the scope of the appended claims. Moreover, claim language reciting "at least one of" a set indicates that one member of the set or multiple members of the set satisfy the claim.

We claim:

1. A computer-implemented method comprising:
identifying a plurality of keys wherein each key is associated with a mask value, and wherein each key from among a first subset of the plurality of keys share a first common mask value;
entering the first subset of the plurality of keys into a first table stored in a random access memory (RAM), wherein the first table is associated with the first common mask value;
entering a remaining plurality of keys that do not share a common mask value into a ternary content addressable memory (TCAM);
identifying among the plurality of key, a second subset of the plurality of keys having a second common mask value;
entering the second subset of the plurality of keys having a second common mask value into a second table stored in a random access memory (RAM), wherein the second table is associated with the second common mask value;
receiving a lookup request for a desired key comprising a value;
performing an AND operation between the value and the common masks of each of the first table and the second table, respectively;
hashing a result of the AND operation to provide an index used to locate the desired key in at least one of the first and second tables; and
returning one or more matching keys located in the first and second tables.

2. The computer-implemented method of claim 1, further comprising:
identifying among the plurality of keys, a second subset of the plurality of keys having a second common mask value; and
entering the second subset of the plurality of keys having a second common mask value into a second table stored in a random access memory (RAM), wherein the second table is associated with the second common mask value.

3. The computer-implemented method of claim 1 comprising:
performing a range check on a field associated with the matching keys; and
returning results having both a matching key and a value meeting the range check, such results being known as having a complete match.

4. The computer-implemented method of claim 3, further comprising:
when two or more keys have a complete match, determining a relative priority between the two or more keys; and
returning the key having the highest priority.

5. The computer-implemented method of claim 2 wherein the first and second tables are part of a collection of a finite number of possible tables, and wherein identifying the first subset of the plurality of keys further comprises:
determining if an optimized organization of the collection of finite tables can be achieved by dividing a portion of the keys into subparts, each subpart having a respective mask;
identifying two or more keys having a common mask associated with a first subpart of the respective key, and entering the first subpart of the two or more keys into the first table; and
entering a remaining subpart of the two or more keys into a third table that is not associated with a common mask value.

6. The computer-implemented method of claim 1 wherein the first common mask value is determined for each of the plurality of keys by splitting the key value and the respective mask value into a first key part, a second key part, a first mask part, and a second mask part;
determining a maximum number of keys of the plurality of keys having a first mask part that have matching bits; and
designating the first mask part as the first common mask.

7. The computer-implemented method of claim 1 further comprising:
swizzling an order of bits in the mask value for a subset of keys to locate additional keys having the first common mask.

8. A machine comprising:
a processor;
a random access memory (RAM) configurable to store a collection of tables, each including a collection of keys associated with a common mask value;
a ternary content addressable memory (TCAM) configurable to store keys not stored in the collection of tables in the RAM, and to store a respective mask value for each key; and a
a non-volatile memory storing code, executable by the processor, the code effective to cause the processor to:
receive a lookup request for a desired key, the lookup request comprising a value;
perform an AND operation between the value and the common masks of each of the collection of tables, respectively;
hashing a result of the AND operation to provide an index used to locate the desired key in at least one of the collection of tables; and
returning matching keys.

9. The machine of claim 8, wherein at least two of the collection of tables stored in the RAM have different mask values.

10. The machine of claim 8, wherein the code is further effective to cause the processor to:
hash the result of the AND operation to provide an index to the respective table, the index pointing to the desired key.

11. The machine of claim 8, wherein the code is further effective to cause the processor to:
perform a range check on a field associated with the matching keys; and
return results having both a matching key and a value meeting the range check, such results being known as having a complete match.

12. The machine of claim 11, wherein the code is further effective to cause the processor to:
when two or more keys have a complete match, determine a relative priority between the two or more keys; and
return the key having the highest priority.

13. The machine of claim 8 wherein the first common mask is associated with the collection of keys as a first set of flip flops stored in the TCAM.

14. The machine of claim 8 wherein an entry in the table includes:
an uncommon mask portion including bits in mask values that are not part of the common mask value for each key in the collection of keys.

15. A system comprising:
a processor; and
a non-transitory computer-readable storage medium storing instructions which, when executed by the processor, cause the processor to perform operations comprising:
identifying a first subset of entries from among a plurality of entries, wherein the first subset of entries share a first common mask value, each of the plurality of entries having a key value and an associated mask value, the first common mask value including at least a portion of bits in the key value that are the same for the first subset of entries;
identifying a second subset of entries of the plurality of entries that have a second common mask value;
including the first subset of entries of the plurality of entries in a first table, and associating the first common mask with the first table;
including the second subset of entries of the plurality of entries in a second table, and associating the second common mask with the second table;
receiving a lookup request for a desired key comprising a value;
performing an AND operation between the value and the common masks of each of the first table and the second table, respectively;
hashing a result of the AND operation to provide an index used to locate the desired key in at least one of the first and second tables; and
returning a matching key.

16. The system of claim 15 further comprising an overflow ternary content addressable memory (TCAM) for storing entries not sharing a common mask value.

17. The system of claim 15 wherein an entry in the first table or the second table comprises:
an uncommon mask portion including bits of the mask value for the plurality of entries that do not form a part of the common mask, and the key value for each of the plurality of entries in the first table or the second table.

\* \* \* \* \*